(12) United States Patent
Mossoba et al.

(10) Patent No.: US 9,523,719 B2
(45) Date of Patent: Dec. 20, 2016

(54) CURRENT SENSOR

(71) Applicant: Bose Corporation, Framingham, MA (US)

(72) Inventors: Joseph Taher Mossoba, Cambridge, MA (US); Manoel Soares, Natick, MA (US); Michael B. Nussbaum, Newton, MA (US)

(73) Assignee: Bose Corporation, Framingham, MA (US)

( * ) Notice: Subject to any disclaimer, the term of this patent is extended or adjusted under 35 U.S.C. 154(b) by 70 days.

(21) Appl. No.: 14/512,194

(22) Filed: Oct. 10, 2014

(65) Prior Publication Data

US 2016/0103155 A1    Apr. 14, 2016

(51) Int. Cl.
| | | |
|---|---|---|
| G01V 3/15 | (2006.01) | |
| G01R 15/20 | (2006.01) | |
| H02M 1/00 | (2006.01) | |

(52) U.S. Cl.
CPC .......... *G01R 15/207* (2013.01); *G01R 15/202* (2013.01); *G01R 15/205* (2013.01); *H02M 1/00* (2013.01); *H02M 2001/0009* (2013.01)

(58) Field of Classification Search
CPC .......... G01R 33/02; G01R 33/00; G01R 33/09
USPC ......... 324/207.15, 654, 76.75; 323/247, 272, 323/282, 290, 301, 305, 328, 355, 363; 361/268
See application file for complete search history.

(56) References Cited

U.S. PATENT DOCUMENTS

| | | | |
|---|---|---|---|
| 6,249,418 B1 * | 6/2001 | Bergstrom ................ | F01L 9/04 361/152 |
| 6,414,469 B1 * | 7/2002 | Zhou ........................ | G05F 1/62 323/272 |
| 6,597,169 B2 * | 7/2003 | Morooka ........... | G01R 33/0356 324/248 |
| 6,879,136 B1 | 4/2005 | Erisman et al. | |
| 7,511,476 B2 * | 3/2009 | Taylor .................... | G01D 5/243 324/207.15 |
| 8,120,346 B2 * | 2/2012 | Ostrom ................. | H02M 3/156 323/272 |
| 8,258,777 B2 * | 9/2012 | Chen ...................... | G01B 7/023 324/207.15 |
| 8,350,537 B2 | 1/2013 | Sheen | |
| 8,378,743 B2 | 2/2013 | Sheen | |

(Continued)

FOREIGN PATENT DOCUMENTS

| | | |
|---|---|---|
| WO | WO 93/21689 | 10/1993 |
| WO | WO 2009/077856 | 6/2009 |

OTHER PUBLICATIONS

Patel; "A Thesis—Current Measurement in Power Electronic and Motor Drive Applications—A Comprehensive Study"; 2007; 123 pp.

(Continued)

*Primary Examiner* — Vinh Nguyen
*Assistant Examiner* — Alvaro Fortich
(74) *Attorney, Agent, or Firm* — Fish & Richardson P.C.

(57) ABSTRACT

An example circuit may include an inductor; a low-frequency sensor connected to the inductor; a high-frequency sensor connected to the inductor; and an integrator connected to the low-frequency sensor and the high frequency sensor, comprising one or more resistive devices and one or more capacitive devices, wherein the integrator is characterized by a time constant that varies as a function of the inductance of the inductor. The inductor may, for example, be part of a switched-mode power supply or an amplifier.

22 Claims, 7 Drawing Sheets

(56) References Cited

U.S. PATENT DOCUMENTS

| | | | | |
|---|---|---|---|---|
| 8,664,923 | B2* | 3/2014 | De Cremoux | H02M 1/14 |
| | | | | 323/223 |
| 9,176,203 | B2* | 11/2015 | Ivanov | G01R 33/02 |
| 2003/0071609 | A1* | 4/2003 | Blakely | G01R 15/183 |
| | | | | 324/127 |
| 2005/0116699 | A1* | 6/2005 | Mazda | G01R 19/0092 |
| | | | | 323/283 |
| 2006/0238176 | A1 | 10/2006 | Zafarana et al. | |
| 2010/0157628 | A1* | 6/2010 | Mangraviti | H02M 3/33507 |
| | | | | 363/16 |
| 2011/0109286 | A1* | 5/2011 | Hsu | H03K 7/08 |
| | | | | 323/282 |
| 2013/0328538 | A1* | 12/2013 | Fox | H02M 3/156 |
| | | | | 323/282 |
| 2014/0095086 | A1 | 4/2014 | Parker et al. | |

OTHER PUBLICATIONS

Dalessandro, et al.; "High-Performance Planar Isolated Current Sensor for Power Electronics Applications"; IEEE Transactions on Power Electronics; vol. 22, No. 5; Sep. 2007; pp. 1682-1692.
International Search Report and Written Opinion; PCT/US2015/054248; Jan. 21, 2016; 13 pp.

* cited by examiner

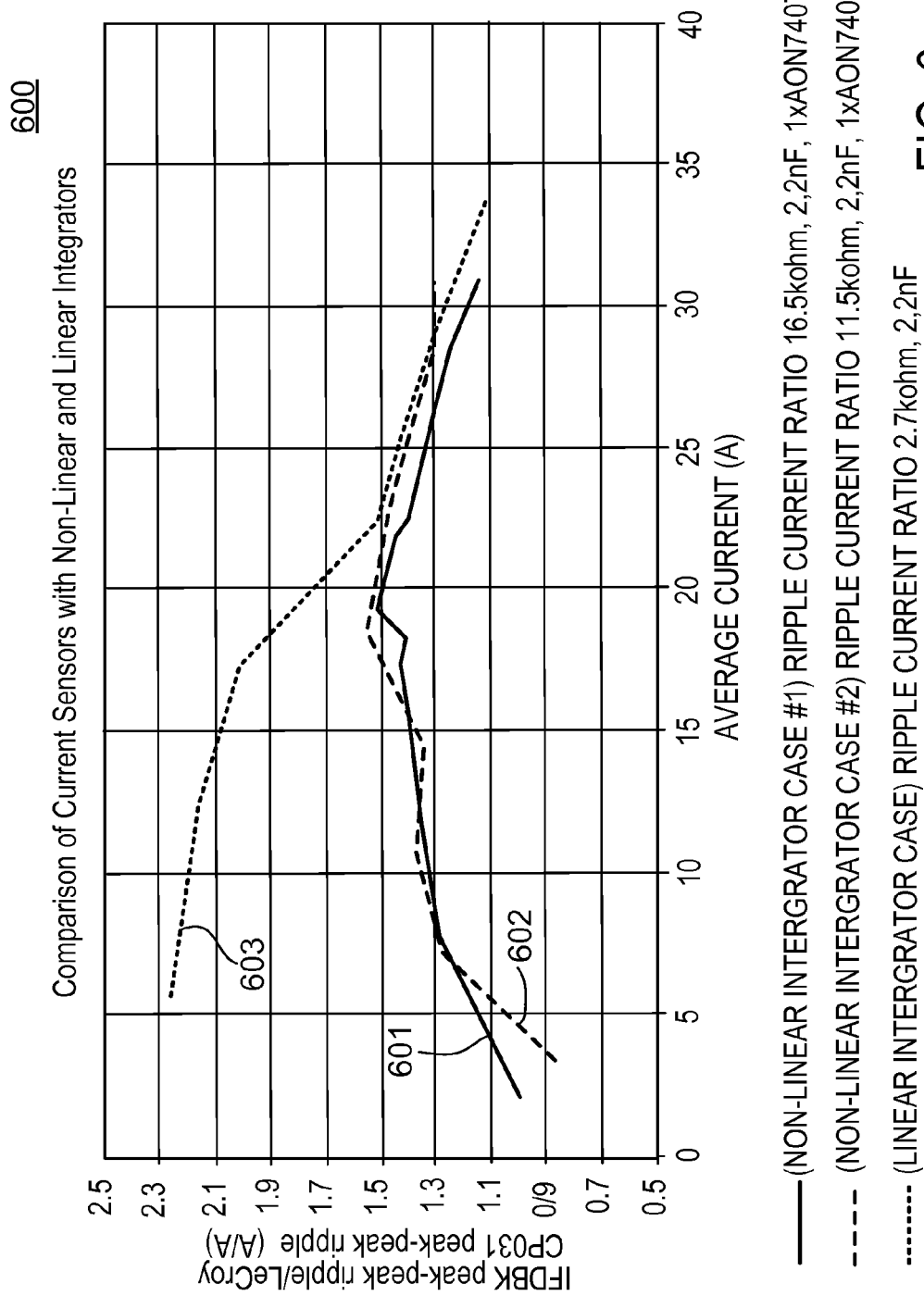

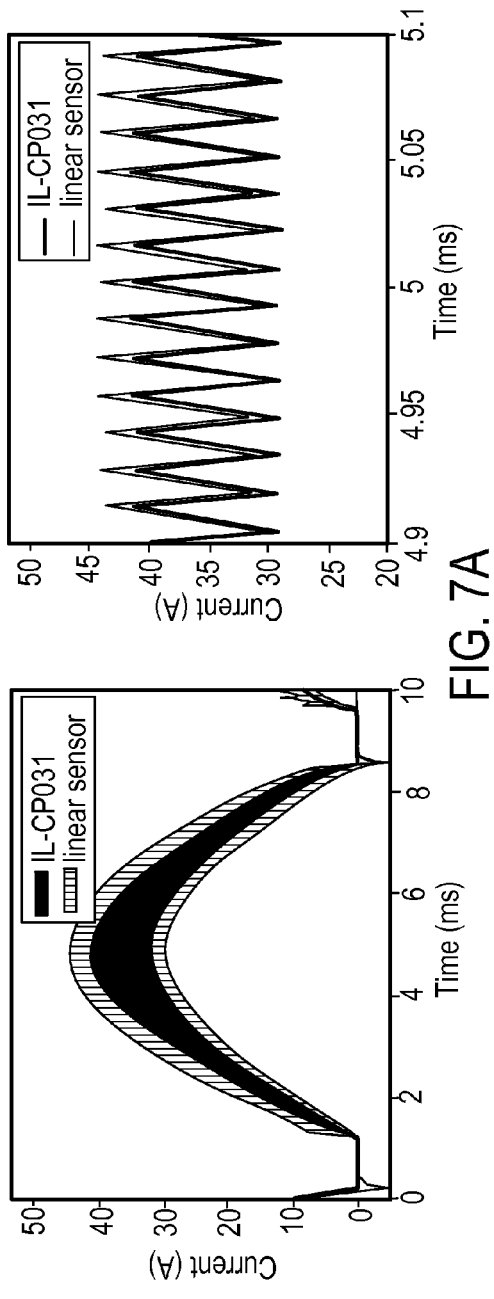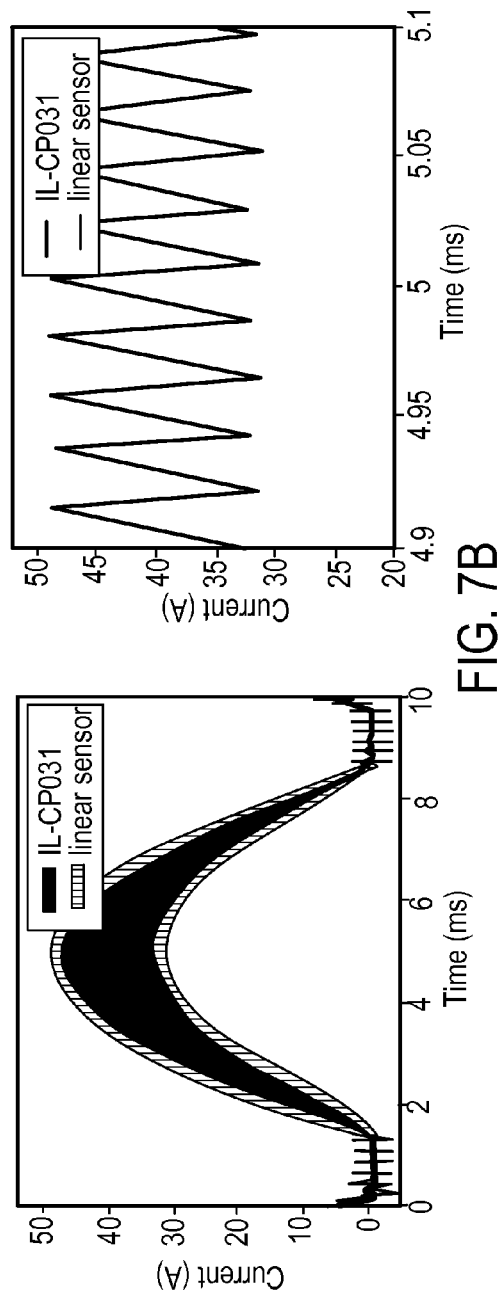
FIG. 7A
FIG. 7B

CURRENT SENSOR

TECHNICAL FIELD

This disclosure relates generally to sensing current in an inductor.

BACKGROUND

A variety of types of power supplies (also called power converters) provide an approximately constant (e.g., DC or "direct current") output voltage from a sinusoidal (e.g., AC or "alternating current") input voltage (e.g., from an AC mains source), thus providing AC-DC conversion (also called "rectification"). Other types of power supplies provide AC-AC conversion, DC-DC conversion, or DC-AC conversion (also called "inversion"). Some power supplies include multiple stages, which may include a combination of different types of converters, such as a DC-DC converter stage within a DC-AC power supply. Converter stages that provide a DC voltage may use a regulator to maintain the DC voltage near a constant value. A linear power supply uses a linear regulator, and a switched-mode (or "switching") power supply uses a switching regulator that switches between on and off states to regulate power transfer and maintain the DC voltage.

Current sensing may be useful in power supply circuits, as well as other circuit topologies.

SUMMARY

An example circuit may include an inductor; a low-frequency sensor connected to the inductor; a high-frequency sensor connected to the inductor; and an integrator connected to the low-frequency sensor and the high frequency sensor, comprising one or more resistive devices and one or more capacitive devices, wherein the integrator is characterized by a time constant that varies as a function of the inductance of the inductor. The inductor may, for example, be part of a switched-mode power supply or an amplifier.

The low-frequency sensor may be, for example, an open loop Hall effect sensor, a closed loop Hall effect sensor, a flux gate sensor, a giant magneto resistance sensor, a resistive sensor, or a DC resistance sensor. The high-frequency sensor may be, for example, a sense winding.

Two or more of the features described in this disclosure/specification, including this summary section, can be combined to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

FIG. 6 shows example plots of the ratio of the current sensed by three current sensors to the current sensed by an oscilloscope probe.

FIGS. 7A and 7B show example graphs comparing the current measured by current sensors with non-linear and linear integrators.

Like reference symbols in the various drawings indicate like elements.

DETAILED DESCRIPTION

Figure 1:
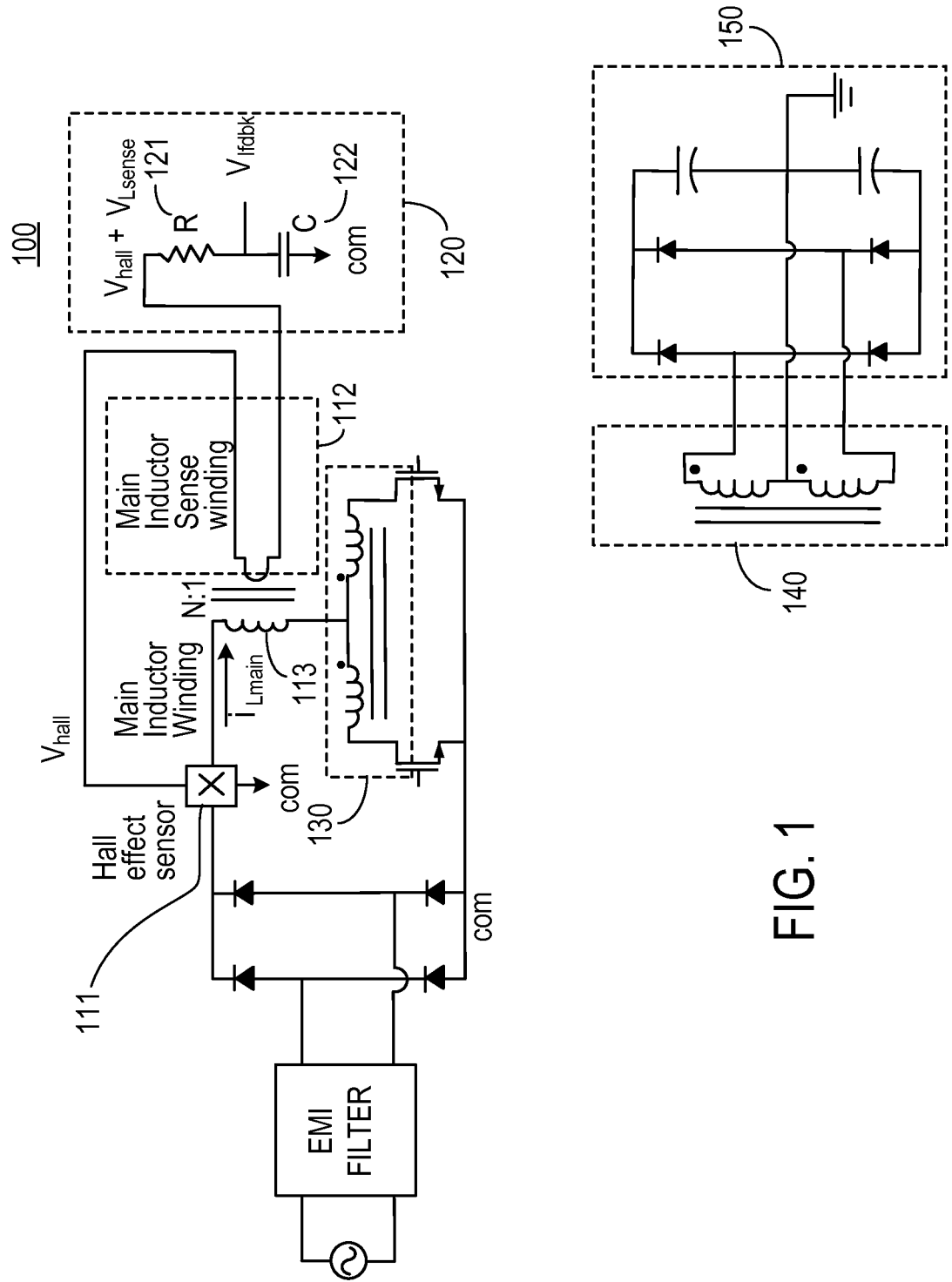
FIG. 1 shows an example circuit diagram.

Switched-mode power supplies can be classified as having different types of circuit topologies. For example, some topologies include one or more stages that have certain arrangements of components that perform specific functions (e.g., buck, boost, or buck-boost stages). Some "isolated" circuit topologies provide "isolation" using a transformer to prevent certain current flows between isolated stages of the power supply. Examples of different circuit topologies that can be configured to provide isolation include, but are not limited to: full bridge, half bridge, and push-pull. These circuit topologies correspond to different arrangements of switches, and can be used in either isolated or non-isolated power supplies. Another example of a circuit topology that can be configured to provide isolation is flyback, which refers to a specific way of using a transformer. Certain classes of power supply are also identified by certain specific features of their circuit topology. For example, a power supply (whether switched-mode or linear) that operates directly from an AC mains source is called an "off-line" power supply.

Some power supply circuits use power factor correction (PFC) to increase the circuit's "power factor" which can be defined as the ratio of the total "active power" (the true power being drawn from the source) to the total "apparent power" drawn from the source (based on a vector sum of the true power and the reactive power at the output). Increasing the power factor may reduce losses incurred in the upstream power distribution system. Some power supplies having PFC functionality include two stages: a front end boost converter controlled as a PFC stage, and an isolated DC/DC converter as a second stage. Some two-stage converters have a number of positive attributes, including reduced total switch root mean square (RMS) current for a given output power. For some applications, the ability to supply large peak power is useful. Power supplies for audio applications, for example, may supply peak powers of at least three times the average power. Other attributes besides RMS currents at maximum output can dominate the economics and desirability of a power supply under these circumstances.

Current sensors may be used in a variety of circuits for a variety of purposes. The remainder of this paragraph describes a few non-limiting example applications of current sensors. A current sensor may provide feedback to a variety of closed-loop systems including switched-mode power supplies and amplifiers. For switched-mode power supplies, the feedback may assist with peak current control, load line regulation, flux balancing, and easing output voltage feedback gain requirements that compensate for current feedback model errors which may reduce the system's sensitivity to output voltage sensor noise. A current sensor may also be used in open-loop systems, such as systems where the sensed value is used to trigger over-current shutdown mechanisms. For example, a current sensor may be used to trigger a shut-down when an amplifier is operating beyond a safe load. A current sensor may also be used as an input in feed-forward systems. For example, a sensed power supply current may be fed forward to modify the PFC current and voltage setpoints as shown in U.S. Pat. No. 8,350,537. As another example, a sensed amplifier current may be fed forward to change the configuration of a system used to mitigate dead-time distortion as shown in U.S. Pat. No. 8,378,743. A current sensor may also be used to control the current output from a current source or a constant current supply. Examples of such systems include certain types of battery chargers, power supplies for electroplating, arc lamp power supplies, and welding power supplies. A current sensor may also be used in some motors/actuators where force/torque are controlled using the current through their windings.

A compound current sensor may include a low-frequency sensor and a high-frequency sensor. An example low-frequency sensor may be suitable for, e.g., measuring currents with frequencies below 20 kHz (e.g., DC currents). An example high-frequency sensor may be suitable for, e.g., measuring currents with frequencies at or above 20 kHz. In this regard, the terms "low" and "high" do not have precise numerical connotations, but rather are relative terms denoting a relationship that may be met by any appropriate numerical values. Thus, as additional examples, the cutoff frequency may be 200 Hz, 500 Hz, 50 kHz, 100 kHz, 200 kHz, etc. As yet another example, the low-frequency sensor may be suitable for measuring currents below 15 kHz and the high frequency sensor may be suitable for measuring currents above 20 kHz.

The outputs of the low- and high-frequency sensors may be connected such that they collectively output a single voltage that varies based on the current being measured. This output voltage may be passed through a low-pass filter (e.g., an integrator) to reduce noise. In some implementations, such as when there are stray electric and magnetic fields, the impact of noise may be reduced by filtering the signals close to the point of use. For example, the low-pass filter may be placed in physically-close proximity to the controller's pins (e.g., 1 cm separation). Some low-pass filters are associated with added phase and reduced gain at higher frequencies, although these effects may be mitigated by using an inductive current sensor. The low-pass filter may then output a feedback voltage to a controller (not shown) that is part of a circuit system such as, e.g., a switched-mode power supply or an amplifier system.

The low-frequency sensor may be, for example, an open loop Hall effect sensor, a closed loop Hall effect sensor, a flux gate sensor, a GMR (giant magneto resistance) sensor, or a resistive sensor. In some implementations, low-frequency currents may be sensed using DC Resistance ("DCR"). The high-frequency sensor may be, for example, a sense winding. Additional information about low- and high-frequency sensors is provided below.

The basic operation of a compound current sensor can be described with reference to an example circuit model 100 shown in FIG. 1. The example circuit model 100 depicts a compound current sensor in the context of a simplified power supply circuit. In this example, the compound current sensor includes an open loop Hall effect sensor 111 (a low-frequency sensor), a sense winding 112 (a high-frequency sensor), and a low-pass filter 120. These devices are connected such that they collectively output a feedback voltage ($V_{Ifdbk}$) that may be used to estimate the current through the main inductor 113 ($I_{Lmain}$). The core of the main inductor may be, for example, a MicroMetals' FluxSan®. The main inductor may be, for example, connected to the primary winding of transformer 130. The output of the secondary winding 140 may be, for example, rectified by rectifier 150 that includes diodes and smoothing capacitors.

The Hall effect sensor 111 may be configured for measuring low-frequency currents through the main inductor 113. In some cases, Hall effect sensors are small-sized, inexpensive, and cause relatively little electrical interference. The Hall effect sensor may be, for example, an Allegro MicroSystems® ACS758LCB-050B-PFF-T. The Hall effect sensor may measure the current through the input or the output of the main inductor 113, which may be substantially similar in steady-state operations.

In some implementations, current through the main inductor 113 ($I_{Lmain}$) induces a voltage in the Hall effect sensor 111 ($V_{hall}$). An example expression of this induced voltage ($V_{hall}$) is $$V_{hall} = \frac{k_{hall}}{\tau_h s + 1} I_{Lmain}$$

This equation represents a linear first-order model in the Laplace domain. In this example, the variable $k_{hall}$ is the gain of the Hall effect sensor. The variable $\tau_h$ is the Hall effect sensor's time constant. The variable s is the Laplace variable. The variable $I_{Lmain}$ is the current through the main inductor 113.

The sense winding 112 may be configured for measuring high-frequency currents through the main inductor 113. The sense winding may be inductively connected to the main inductor as one or more turns on the main inductor's core, although the following examples use a single turn. In this example, the rate of change of current through the main inductor induces a voltage in the sense winding ($V_{Lsense}$) that varies in response to the rate of change of the current through the main inductor. An expression of this induced voltage ($V_{Lsense}$) is $$V_{Lsense} = \frac{1}{N} V_{Lmain}$$

This equation may be represented in the Laplace domain as $$V_{Lsense} = s \frac{L_{main}}{N} I_{Lmain}$$

In this equation, the variable s is the Laplace variable. The variable $L_{main}$ is the inductance of the main inductor 113. The variable $I_{Lmain}$ is the current through the main inductor. The variable N is the ratio of turns of the main inductor 113 relative to the sense winding 112. In the example circuit of FIG. 1, N is the number of turns on the main inductor 113 (the example sense winding 112 only includes one turn).

In this example, the outputs of the Hall effect sensor 111 and sense winding 112 are connected such that they collectively output a single voltage that varies in response to the current being measured. Although the output of the Hall effect sensor 111 is upstream relative to the sense winding 112, an opposite configuration may be used in some implementations. In some implementations, the outputs of the Hall effect sensor 111 and sense winding 112 are not connected in series. For example, the outputs (corresponding to voltages $V_{hall}$ and $V_{Lsense}$) may be combined using a summing op-amp that outputs to a controller.

As shown in FIG. 1, the output of the sense winding 112 has a voltage of approximately $V_{hall}+V_{Lsense}$. In this example, sense winding 112 is connected to resistor 121. The resistor 121 and the capacitor 122 collectively form a low-pass filter 120 (integrator) that outputs a feedback voltage $V_{Ifdbk}$. The low pass filter stage approximates the integration of the sensed inductor voltage to reconstruct inductor ripple current, according to $$I_{Lripple} \cong \int \frac{V_{Lmain}}{L_{main}} dt + c$$

The feedback voltage ($V_{Ifdbk}$) may be modeled in the Laplace domain as $$V_{Ifdbk} = \frac{1}{RCs+1}(V_{hall} + V_{Lsense}) = \frac{1}{RCs+1}\left(\frac{k_{hall}}{\tau_h s + 1} + \frac{sL_{main}}{N}\right)I_{Lmain}$$

where the R and C parameters are associated with resistors 121 and capacitors 122 in the low-pass filter 120. This equation may be reconfigured into a transfer function gain, as follows:

$$\frac{V_{Ifdbk}}{I_{Lmain}} = \left(\frac{k_{hall}}{(\tau_h s+1)(RCs+1)} + \frac{sL_{main}}{N(RCs+1)}\right)$$

This equation may then be reconfigured to $$\frac{V_{Ifdbk}}{I_{Lmain}} = k_{hall}\left(\frac{1}{(\tau_h s+1)(RCs+1)} + \frac{sL_{main}}{k_{hall} N(RCs+1)}\right)$$

Figure 2:
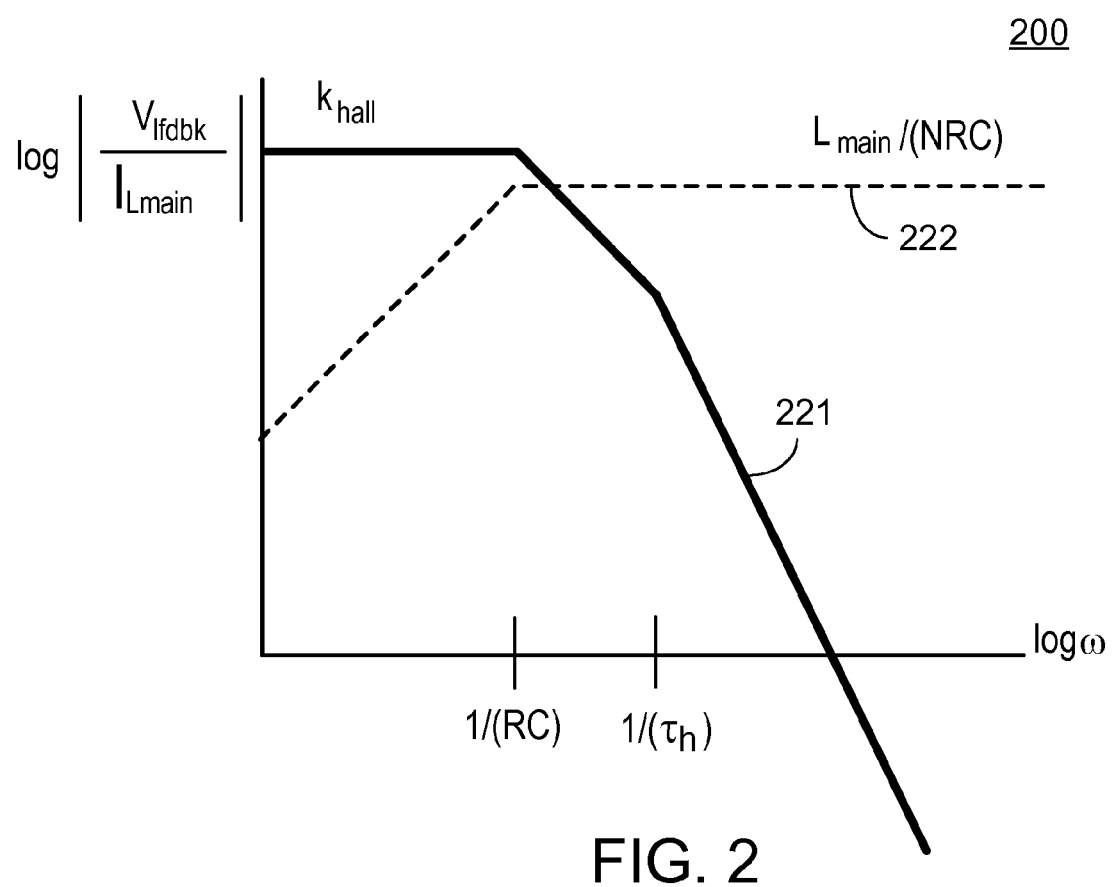
FIG. 2 shows an example Bode plot, not necessarily drawn to scale.

FIG. 2 shows an example Bode plot 200 of the transfer function gain contributions from a Hall effect sensor and a sense winding. As shown in FIG. 2, the gain associated with low frequency currents is primarily derived from the Hall effect sensor (represented by the solid line 221), whereas the gain associated with high frequency currents is primarily derived from the sense winding (represented by the dashed line 222).

The above transfer function has corner frequencies corresponding to $(1/RC)$ and $(1/\tau_h)$. Example values for corner frequencies and gains are $$\frac{1}{2\pi\tau_h} = 120 \text{ kHz}, \frac{1}{2\pi RC} = 1-10 \text{ kHz, and } k_{hall} = 40\frac{\text{mV}}{\text{A}} * \frac{(Vcc-Vss)}{5 \text{ V}},$$

where the gain is ratiometric with the Hall effect sensor's bias voltage. The Hall effect sensor 111 may be biased such that an input current of 0 A causes the sensor to output a voltage greater than 0V. This may be because, for example, the Hall effect sensor was designed to output to a controller (e.g., an analog or digital controller) that is sensitive to noise when its input voltage is close to 0V.

In some implementations, the above transfer function may be simplified. For example, the R and C variables may be selected such that $$RC = \frac{L_{main}}{Nk_{hall}},$$

and the Hall effect sensor may be selected such that $\tau_h$ is relatively small compared to RC (thereby causing $\tau_h$ to have relatively little influence on the feedback voltage compared to RC). For example, $\tau_h$ may be half of RC, a fifth of RC, a tenth of RC, etc. When $\tau_h$ is relatively small compared to RC, and $$RC = \frac{L_{main}}{Nk_{hall}},$$

the feedback voltage may be approximated as $V_{Ifdbk} \approx k_{hall} I_{Lmain}$.

Figure 3:
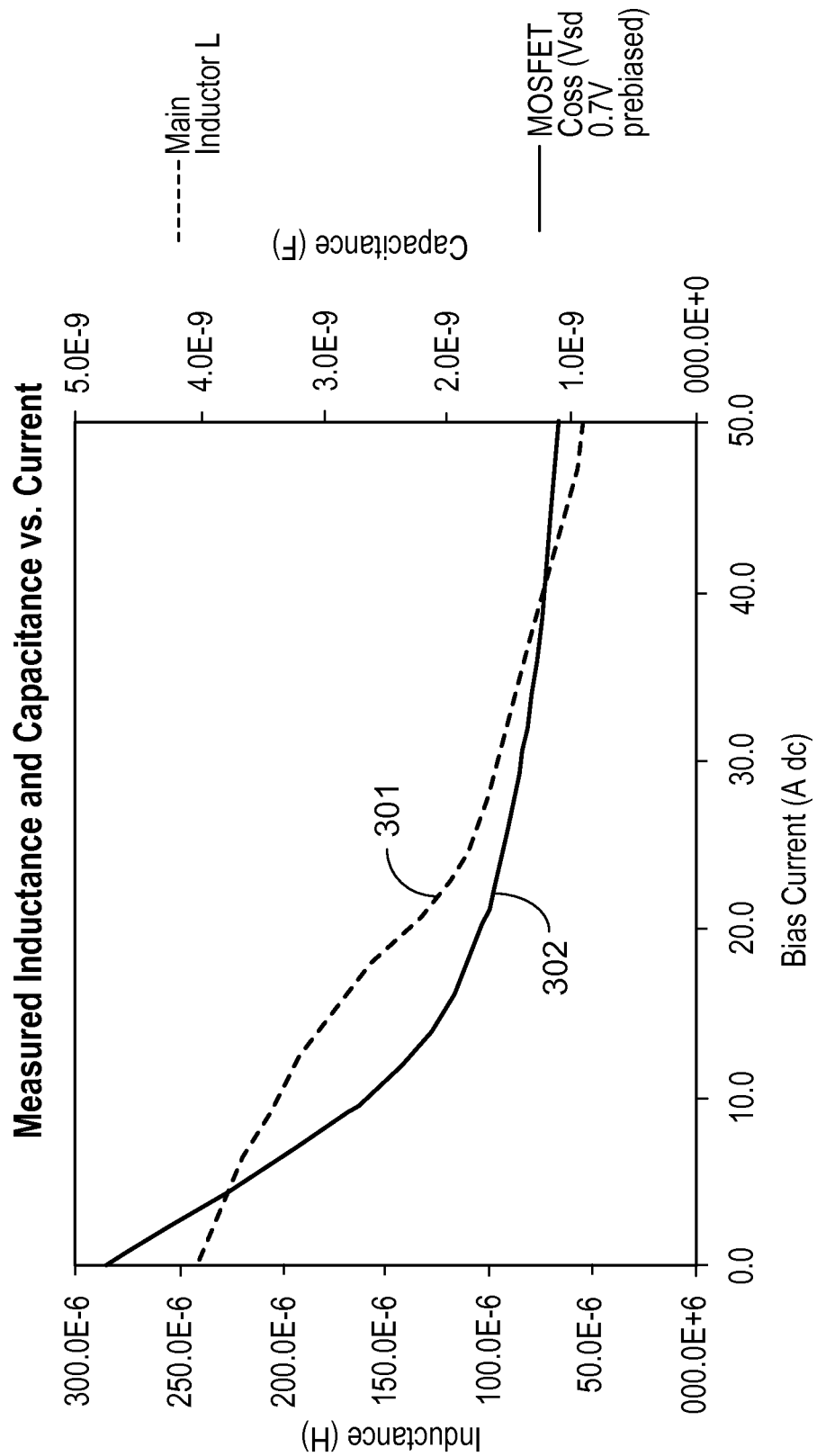
FIG. 3 shows an example graph of inductance and capacitance as a function of current.

The previous examples assume that the main inductor has an inductance $L_{main}$ that does not vary with current $I_{Lmain}$. This may not be the case in practice due, in part, to inductor saturation. FIG. 3 shows an example plot of the main inductor's inductance $L_{main}$ versus current $I_{Lmain}$, represented as dashed line 301. As shown in FIG. 3, the inductance $L_{main}$ varies non-linearly with current $I_{Lmain}$. Therefore, using a single value of $L_{main}$ for the inductor ripple current integral $$\left(I_{Lripple} \cong \int \frac{V_{Lmain}}{L_{main}} dt + c\right)$$

causes the integral—and the calculated $I_{Lripple}$—to be accurate only at the current that results in that value of $L_{main}$.

Figure 4:
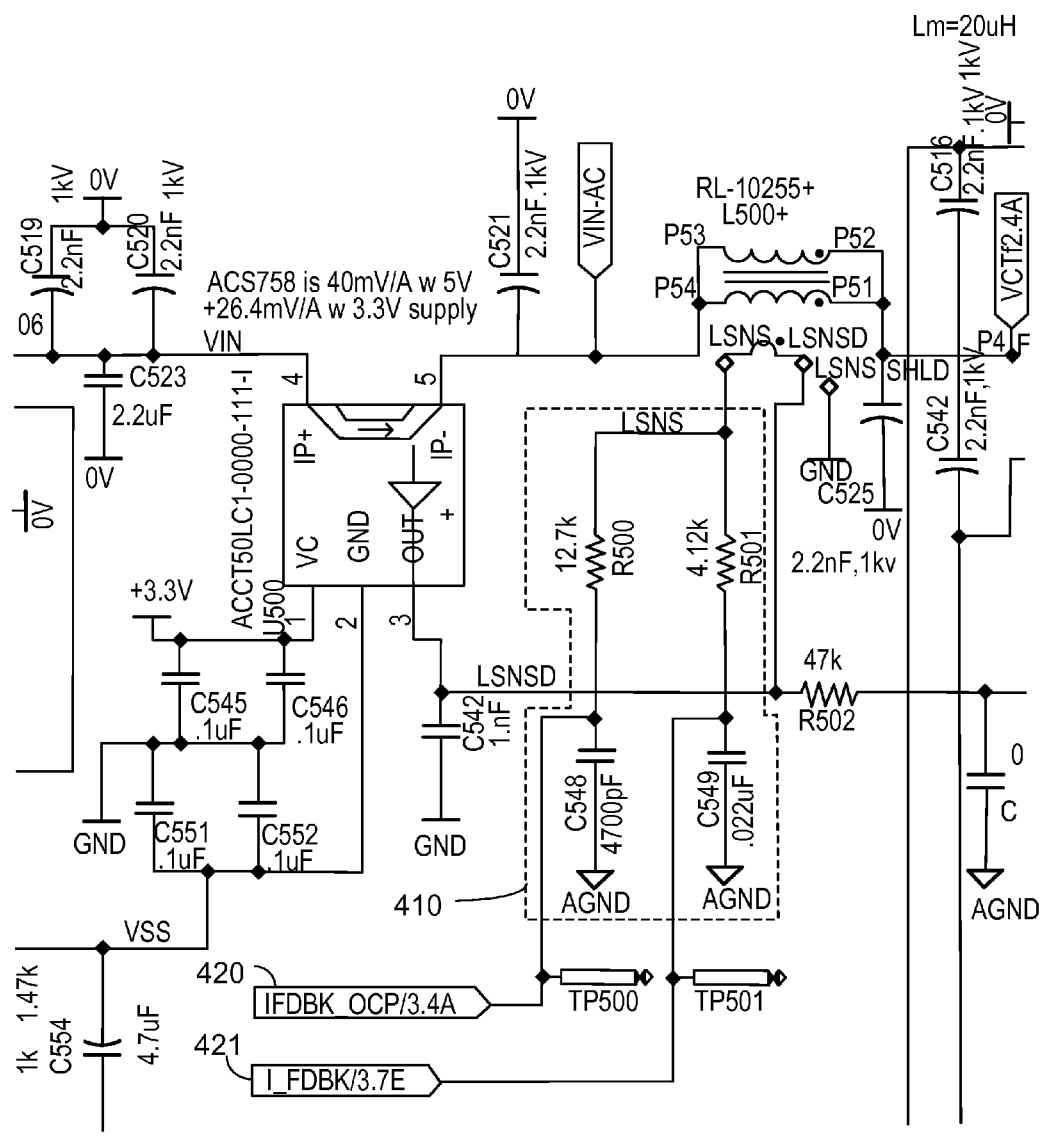
FIG. 4 shows an example circuit diagram of a compound current sensor.

A possible way to reduce the error caused by the variable $L_{main}$ is to utilize multiple RC branches, each configured for measuring different currents $I_{Lmain}$ (which result in different values of $L_{main}$). FIG. 4 shows an example circuit diagram that utilizes two RC branches 410.

The first RC branch may be configured for measuring relatively low currents that are associated with relatively high inductances. For example, RC may be selected such that $$RC \cong \frac{L_{main\_high}}{Nk_{hall}},$$

where $L_{main\_high}$ is the main inductor's (higher) inductance at a lower current. Such currents and inductances may be encountered when, for example, the core of the main inductor 113 is not saturated. As another example, such currents and inductances may be encountered when a converter is operating in its expected control range (e.g., when $I_{Lmain} < 30$ A for some converters).

The second RC branch may be configured for measuring relatively high currents that are associated with relatively low inductances. For example, RC may be selected such that $$RC \cong \frac{L_{main\_low}}{Nk_{hall}},$$

where $L_{main\_low}$ is the main inductor's (lower) inductance at a higher current. Such currents and inductances may be encountered when, for example, the core of the main inductor 113 is saturated. As another example, such currents and inductances may be encountered when a converter is operating above its expected control range (e.g., $I_{Lmain} \geq 30$ A for some converters), possibly during high peak currents seen during overcurrent protection events.

The two RC branches are shown in FIG. 4, and their output voltages and associated corner frequencies are IFDBK 421 (1.76 kHz) and IFDBK_OCP 420 (2.67 kHz). In some implementations, accuracy may be improved by utilizing additional RC branches, each tailored to measuring different values of current as described above.

Another possible way to mitigate the error caused by the variable $L_{main}$ is to utilize an integrator with an RC time constant (the product of the integrator's overall resistance and overall capacitance) that varies as a function of the main inductor's inductance. For example, the integrator's time constant may vary proportionally with the main inductor's inductance ($L_{main}$) such that the quantity $$\frac{L_{main}}{NRC}$$

remains substantially constant. This may be accomplished by, starting with a determined (e.g., tested or known) relationship between $L_{main}$ and $I_{Lmain}$, selecting and configuring the integrator's constituent devices such that the integrator's time constant (which varies in direct response to changes in the low-frequency sensor's output voltage, which itself varies in direct response to changes in $I_{Lmain}$) varies proportionally with $L_{main}$ (which varies in direct response to changes in $I_{Lmain}$). The integrator's variable time constant may allow the inductor ripple current integral $$\left( I_{Lripple} \cong \int \frac{V_{Lmain}}{L_{main}} dt + c \right)$$

to remain accurate over a wider range of input currents.

The integrator's time constant may be variable due to, for example, one or more non-linear devices such as a non-linear resistor (e.g., a resistor that has a non-linear relationship between resistance and current), a non-linear capacitor (e.g., a capacitor that has a non-linear relationship between capacitance and voltage), a non-linear transistor (e.g., a MOSFET that has a non-linear relationship between capacitance and voltage), or another type of non-linear device. The non-linear device may be, for example, an AON7407 20V P-Channel MOSFET made by Alpha & Omega Semiconductor®. In some implementations, a plurality of non-linear devices are used. In some implementations, one or more non-linear devices are used in conjunction with one or more linear devices. The devices may be selected and configured such that the integrator's time constant varies as a function of the main inductor's current.

Figure 5:
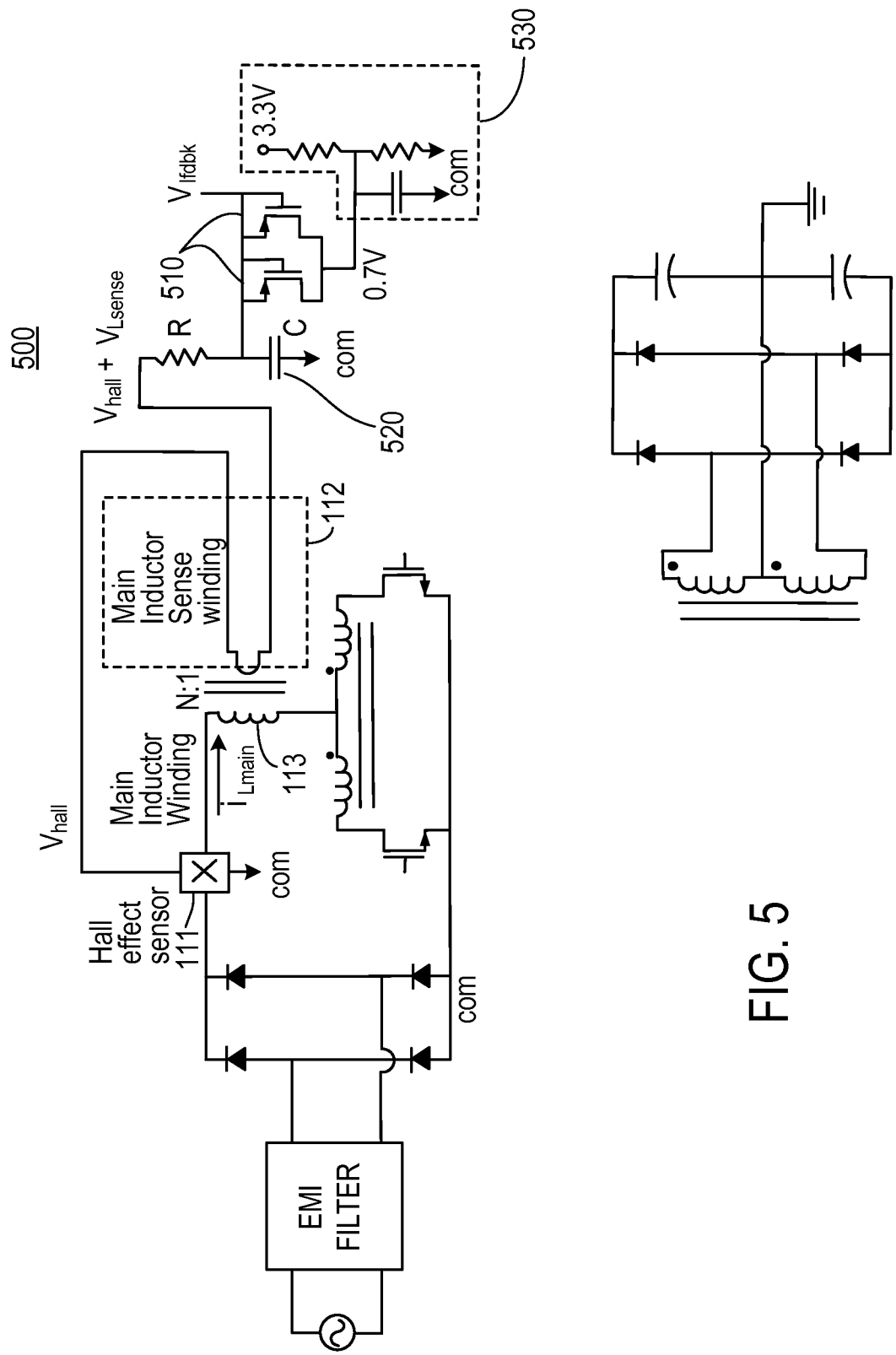
FIG. 5 shows an example circuit diagram of a compound current sensor that includes a non-linear integrator.

FIG. 5 shows an example compound current sensor that utilizes a non-linear integrator to track the non-linear relationship between $L_{main}$ and $I_{Lmain}$, thereby improving the sensor's accuracy over a range input currents. The integrator's time constant is non-linear due to the non-linear output capacitance of the MOSFETs 510. The MOSFETs are electrically connected to capacitor 520. The MOSFETS 510 are each AON7407 20V P-Channel MOSFETs made by Alpha & Omega Semiconductor®. In some implementations, one or both of these MOSFETs may be replaced with a different MOSFET or a capacitor.

As shown in FIG. 5, the MOSFETs 510 may be pre-biased. For example, the MOSFETs' may be pre-biased by voltage divider 530 to make the integrator's variable time constant better track the main inductor's variable inductance. Pre-biasing the MOSFETs' may also help compensate for any pre-bias of the Hall effect sensor.

FIG. 3 represents the MOSFETs' capacitance as solid line 302 and the main inductor's inductance as dashed line 301. As shown in FIG. 3, the MOSFETs' capacitance varies as a function of the inductor's inductance.

FIG. 6 shows an example graph 600 of the ratio of peak-peak ripple current measured by an oscilloscope probe to the peak-peak current measured by three sensor cases: (1) a non-linear integrator with a single MOSFET represented by solid line 601, (2) a non-linear integrator with two MOSFETs represented by dashed line 602, and (3) a linear integrator represented by dotted line 603. A ratio of one (e.g., a value of one on the vertical axis) indicates that an oscilloscope probe and the current sensor made similar measurements. As shown in FIG. 6, the peak-to-peak ripple current measured by the non-linear integrators (as compared to the linear integrator) better match the peak-to-peak ripple measured by the oscilloscope probe over a wide range of currents (e.g., between average currents of 6 Amps and 28 Amps for non-linear integrator case #2 represented as line 601).

FIG. 7A shows an example graph of time domain measurements of $I_{Lmain}$ made using both a linear sensor and a current probe. FIG. 7B shows an example graph of time domain measurements of $I_{Lmain}$ made using both a non-linear sensor and a current probe. A comparison of FIG. 7A and FIG. 7B shows that the measurements of the non-linear sensor (as compared to the linear sensor) better match those of the current probe.

In some implementations, the combination of a Hall effect sensor, sense winding, and non-linear voltage integrator may yield a unipolar DC-coupled signal that achieves a wide bandwidth for currents over 50 A at switching frequencies ranging below 20 kHz to over 200 kHz and for values in between. One benefit to this type of current sensor is that it may result in less phase lag and phase distortion than other types of current sensors.

In implementations where the low-frequency sensor is a DCR sensor, the measurement of low-frequency currents may be facilitated by selecting an RC pole with a frequency that is approximately the same as the DCR/$2\pi L$ zero.

The terms "non-linear" and "linear" are not intended to describe a perfect (i.e. ideal) non-linear or linear relationship. For example, "linear" devices may, in practice, exhibit some relatively small degree of non-linearity. The distinction between linear and non-linear devices, as used herein, will be readily apparent to a person of ordinary skill in the art.

As will be understood by a person of ordinary skill in the art, operating conditions may influence some variables. For example, the main inductor's inductance may also vary as a function of the temperature. In some implementations, operating conditions may be accounted for in the design process.

Various separate elements may be combined into one or more individual elements to perform the functions described herein. Furthermore, some circuit elements can be implemented using multiple discrete elements combined into a circuit that serves a desired function. For example, any of the capacitors, including an output capacitor, can be implemented using a capacitor bank. Elements of different implementations described herein may be combined to form other embodiments not specifically set forth above. Elements may be left out of the structures described herein without adversely affecting their operation.

Though the elements of several views of the drawing may be shown and described as discrete elements in a block diagram and may be referred to as "circuit" or "circuitry," unless otherwise indicated, the elements can be implemented as one of, or a combination of, analog circuitry, digital circuitry, or one or more microprocessors executing software instructions. Software instructions can include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals or video signals or both may be encoded and transmitted in either digital or analog form; conventional digital-to-analog or analog-to-digital converters may not be shown in the figures.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Part of systems and techniques described herein, or portions thereof, can be implemented as a computer program product that includes instructions that are stored on one or more non-transitory machine-readable storage media, and that are executable on one or more processing devices. The systems and techniques described herein, or portions thereof, can be implemented as an apparatus, method, or electronic system that can include one or more processing devices and memory to store executable instructions to implement the stated operations.

Other implementations are within the scope of the following claims.

What is claimed is:

1. A circuit comprising:
   an inductor;
   a low-frequency sensor connected to the inductor;
   a high-frequency sensor connected to the inductor; and
   an integrator connected to the low-frequency sensor and the high frequency sensor, comprising one or more resistive devices and one or more capacitive devices, wherein one or both of: (i) the resistance provided by the one or more resistive devices and (ii) the capacitance provided by one or more capacitive devices vary as a function of inductance of the inductor such that the integrator is characterized by a time constant that varies as a function of the inductance of the inductor.

2. The circuit of claim 1, wherein the low-frequency sensor is an open loop Hall effect sensor, a closed loop Hall effect sensor, a flux gate sensor, a giant magneto resistance sensor, a resistive sensor, or a DC resistance sensor, and the high-frequency sensor is a sense winding.

3. The circuit of claim 1, wherein the low-frequency sensor is a Hall effect sensor and the high-frequency sensor is a sense winding.

4. The circuit of claim 3, wherein the integrator is characterized by a time constant that decreases when the inductance of the inductor decreases in response to an increase in an average current through the inductor.

5. The circuit of claim 4, wherein the integrator is characterized by a time constant that decreases non-linearly when the inductance of the inductor decreases non-linearly in response to an increase in an average current through the inductor.

6. The circuit of claim 5, wherein the integrator is characterized by a time constant that decreases proportionally with the inductance of the inductor when the inductance of the inductor decreases in response to an increase in an average current through the inductor.

7. The circuit of claim 3, wherein at least one of the one or more capacitive devices of the integrator is a capacitor that has a capacitance that decreases as the inductance of the inductor decreases in response to an increase in an average current through the inductor.

8. The circuit of claim 7, wherein at least one of the one or more capacitive devices of the integrator is a capacitor that has a capacitance that decreases non-linearly when the inductance of the inductor decreases non-linearly in response to an increase in an average current through the inductor.

9. The circuit of claim 8, wherein at least one of the one or more capacitive devices of the integrator is a capacitor that has a capacitance that decreases proportionally with the inductance of the inductor when the inductance of the inductor decreases in response to an increase in an average current through the inductor.

10. The circuit of claim 3, wherein at least one of the one or more capacitive devices of the integrator is a transistor that has a capacitance that decreases as the inductance of the inductor decreases in response to an increase in an average current through the inductor.

11. The circuit of claim 10, wherein at least one of the one or more capacitive devices of the integrator is a transistor that has a capacitance that decreases non-linearly when the inductance of the inductor decreases non-linearly in response to an increase in an average current through the inductor.

12. The circuit of claim 11, wherein at least one of the one or more capacitive devices of the integrator is a transistor that has a capacitance that decreases proportionally with the inductance of the inductor when the inductance of the inductor decreases in response to an increase in an average current through the inductor.

13. The circuit of claim 12, wherein the transistor is a MOSFET.

14. The circuit of claim 12, wherein the transistor is pre-biased by a voltage divider.

15. The circuit of claim 3, wherein at least one of the one or more resistive devices of the integrator is a resistor has a resistance that decreases as the inductance of the inductor decreases in response to an increase in an average current through the inductor.

16. The circuit of claim 3, wherein:
   at least one of the one or more capacitive devices of the integrator has a capacitance that decreases as the inductance of the inductor decreases in response to an increase in an average current through the inductor; and at least one of the one or more resistive devices of the integrator has a resistance that decreases as the inductance of the inductor decreases in response to an increase in an average current through the inductor.

17. The circuit of claim 3, wherein the inductor is part of a switched-mode power supply or an amplifier.

18. The circuit of claim 3, wherein the low-frequency sensor and the high-frequency sensor are connected in series.

19. The circuit of claim 3, wherein
the low-frequency sensor is connected to an operational amplifier;
the high-frequency sensor is connected to the operational amplifier; and
the operational amplifier is connected to the integrator.

20. A method, comprising:
determining the inductance of an inductor for a plurality of currents through the inductor;
selecting a low-frequency sensor to output a first voltage in response to a current through the inductor;
selecting a high-frequency sensor to output a second voltage in response to the current through the inductor; and
configuring an integrator to output a third voltage in response to the first voltage and the second voltage, wherein the integrator comprises one or more resistive devices and one or more capacitive devices, and one or both of (i) the resistance provided by the one or more resistive devices and (ii) the capacitance provided by one or more capacitive devices vary as a function of the inductance such that the integrator is characterized by a time constant that varies as a function of the inductance of the inductor for the plurality of currents through the inductor.

21. The method of claim 20, wherein configuring comprises:
selecting the one or more resistive devices; and
selecting the one or more capacitive devices such that the capacitance provided by the one or more capacitive devices varies as a function of the inductance of the inductor for the plurality of currents through the inductor.

22. The method of claim 20, wherein configuring comprises:
selecting the one or more resistive devices such that the resistance provided by the one or more resistive devices varies as a function of the inductance of the inductor for the plurality of currents through the inductor; and
selecting the one or more capacitive devices.

* * * * *